United States Patent [19]

Dentai et al.

[11] Patent Number: 4,830,982

[45] Date of Patent: * May 16, 1989

[54] METHOD OF FORMING III-V SEMI-INSULATING FILMS USING ORGANO-METALLIC TITANIUM DOPANT PRECURSORS

[75] Inventors: Andrew G. Dentai, Atlantic Highlands; Charles H. Joyner, Jr., Middletown; Timothy W. Weidman, Westfield; John L. Zilko, Fanwood, all of N.J.

[73] Assignees: American Telephone and Telegraph Company, New York, N.Y.; AT&T Bell Laboratories, Murray Hill, N.J.

[*] Notice: The portion of the term of this patent subsequent to Nov. 1, 2005 has been disclaimed.

[21] Appl. No.: 59,133

[22] Filed: Jun. 4, 1987

Related U.S. Application Data

[63] Continuation-in-part of Ser. No. 942,452, Dec. 16, 1986, abandoned.

[51] Int. Cl.$^4$ .......................................... H01L 21/285
[52] U.S. Cl. ........................... 437/094; 148/DIG. 40; 148/DIG. 41; 148/DIG. 65; 148/DIG. 110; 156/613; 156/606; 437/81; 437/133; 437/959
[58] Field of Search ............... 29/576 E; 148/1.5, 174, 148/175, 33, 187, DIG. 40, DIG. 65, DIG. 110, DIG. 41; 156/606, 610–614; 427/85, 91, 255.1; 437/81, 94, 104, 107, 133

[56] References Cited

U.S. PATENT DOCUMENTS

| | | | |
|---|---|---|---|
| 3,492,175 | 1/1970 | Conrad et al. | 148/175 |
| 3,519,479 | 7/1970 | Inoue et al. | 148/174 |
| 3,619,288 | 11/1971 | Sirtl | 427/91 |
| 3,702,780 | 11/1972 | Withers | 427/229 |
| 3,867,202 | 2/1975 | Ichiki et al. | 148/175 |
| 3,979,235 | 9/1976 | Boucher | 148/175 |
| 4,031,274 | 6/1977 | Bessen | 427/229 |
| 4,193,835 | 3/1980 | Inoue et al. | 156/606 |
| 4,202,893 | 5/1980 | Cox | 148/175 |
| 4,310,567 | 1/1982 | Tobata et al. | 427/95 |
| 4,328,261 | 5/1982 | Heinecke et al. | 427/91 |
| 4,368,098 | 1/1983 | Manasevit et al. | 156/606 |

OTHER PUBLICATIONS

Takahashi et al., "Chemical Vapor Deposition of TiO$_2$ Film Using an Organometallic Process", J. Chem. Soc., Faraday Trans., 1981, 77, 1051–7.

Coelrayne et al., "Precipitate Identification in Ti-, Cr-, and Ni- Doped InP Single Crystals", J. Crys. Growth, 76 (1986), pp. 251–258.

Moss, R. H. and Evans, J. S., "A New Approach to MOCVD of Indium Phosphide and Gallium-Indium Arsenide," 1981, pp. 129–134, Journal of Crystal Growth, North-Holland Publishing Company.

Bass, S. J. et al., "Metal Organic Vapour Phase Epitaxy of Indium Phosphide," 1983, pp. 68–75, Journal of Crystal Growth 64, North-Holland Publishing Company.

Hsu, C. C. et al., "OMVPE Growth of InP Using TMIn," 1983, pp. 8–12, Journal of Crystal Growth 63, North-Holland Publishing.

Hurle, D. T. J. et al., "GaInAs and GaInAsP Materials Grown by Low Pressure MOCVD for Microwave and Optoelectronic Applications," 10/81, pp. 64–73, Journal of Crystal Growth, North-Holland Publishing Company.

Alferov, Ah I. et al. "Buried InGaAsP/InP Stripe Heterojunction cw Lasers Fabricated by Combined Liquid- and Gas-Phase Epitaxy," 6/82, pp. 296 and 299, Soviet Technical Physics Letters.

Long, J. A. et al., "Growth of Fe-Doped Semi-Insulating InP by MOCVD," 5/84, pp. 10–14, Journal of Crystal Growth, North Holland, Amsterdam.

Speier, P. et al. "MOVPE Growth and Characteristics of Fe-Doped Semi-Insulating InP Layers," 11/86, vol. 22, No. 23, pp. 1216–1217, Electronics Letters.

Nakai, K. et al., "Growth of Iron-Doped Epitaxial Layers for GaAs Field Effect Transistors," 10/77, vol. 124, No. 10, pp. 1635–1640, J. Electrochem. Soc.-:Solid-State Science and Technology.

Brandt, C. D. et al. "New Semi-Insulating InP: Titanium Midgap Donors," 4/86, Applied Physics Letters 48(17).

Primary Examiner—Brian E. Hearn
Assistant Examiner—William Bunch
Attorney, Agent, or Firm—Gregory C. Ranieri

[57] ABSTRACT

Semi-insulating epitaxial layers of Group III-V based semiconductor compounds are produced by a MOCVD process through the use of organic titanium-based compounds. Resistivities greater than $1 \times 10^7$ ohm/cm have been achieved.

22 Claims, 1 Drawing Sheet

METHOD OF FORMING III-V SEMI-INSULATING FILMS USING ORGANO-METALLIC TITANIUM DOPANT PRECURSORS

This application is a continuation-in-part of application Ser. No. 942,452, filed Dec. 16, 1986 now abandoned.

TECHNICAL FIELD

This invention relates to Group III-V materials and, in particular, to Group III-V semi-insulating materials.

BACKGROUND OF THE INVENTION

The Group III-V semiconductor materials such as gallium arsenide, indium phosphide, gallium indium phosphide, indium phosphide arsenide, and gallium indium arsenide phosphide are being utilized for fabrication of various devices such as laser devices or Field Effect Transistors (FET). These devices are formed by a series of deposition processes resulting in a layered structure formed on an essentially single crystal substrate. Generally, a region is introduced within the structure to confine or restrict the flow of current along desired paths, for example, to an active (conductive) region of the device. Various expedients such as a patterned oxide layer or a reverse biased p-n junction are employed for this isolation. However, the oxide layer does not permit epitaxial overgrowth and the p-n junction, while permitting epitaxial overgrowth, yields a structure whose resistivity is highly temperature dependent. Thus, research has been stimulated towards the development of a semi-insulating single crystalline region within the device since the resistivity of such regions may not be strongly temperature dependent and since subsequent overgrowth should be possible.

Semi-insulating material is generally formed by suitably doping the desired Group III-V semiconductor material. For example, in the formation of gallium arsenide based layers for FET applications, one method of forming a semi-insulating gallium arsenide region involves introducing chromium as a dopant. The chromium doped gallium arsenide layer is generally fabricated by chemical vapor deposition (CVD) growth in a gas transport system. In a typical CVD growth procedure, a gallium arsenide wafer is heated and a deposition gas is prepared that includes gallium chloride and arsenic compounds such as As$_2$ and/or As$_4$. These materials are transported in a hydrogen stream or in an inert gas stream such as a helium stream. Upon contacting the heated substrate, gallium arsenide is deposited with the release of a chloride containing gas. The reactions involved are shown in the following equations.

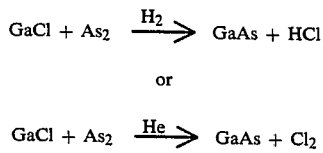

An appropriate dopant precursor is introduced into the deposition gas stream to produce the desired semi-insulating properties. For example, a chromyl chloride dopant precursor as described in U.S. Pat. No. 4,204,893 issued May 27, 1980 is utilized for producing semi-insulating gallium arsenide. However, chromium compounds are not the only dopant precursors that have been suggested for doping gallium arsenide. Other dopant precursors such as iron pentacarbonyl for gallium arsenide doping have been disclosed. (See U.S. Pat. No. 3,492,175 issued Jan. 27, 1970.)

Indium phosphide has also been formed by a CVD process. In particular, a gas stream including volatile indium halide entities such as InCl, InCl$_2$, and In$_2$Cl$_3$ and phosphorus containing entities such as PH$_3$, P$_2$ and P$_4$ are utilized in a hydrogen atmosphere to form indium phosphide and HCl as shown in the following equation.

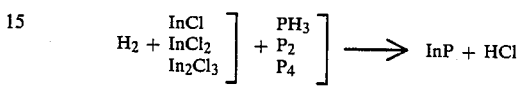

Unlike gallium arsenide deposition, an inert gas carrier system such as a helium carrier system does not result in the deposition of indium phosphide. Since the presence of a reducing carrier such as a hydrogen carrier is necessary in conventional CVD growth of indium phosphide, the dopant precursor employed is limited to those that do not undergo reduction to produce elemental metals of low volatility. Premature reduction to a nonvolatile elemental metal by interaction with the carrier gas does not result in dopant incorporation, but instead induces essentially complete depletion of the dopant either in the gas phase or by formation of the metal on the reactor walls. Therefore, until recently, only chromium-based dopant precursors were utilized to form semiinsulating indium phosphide. (See Alferov et al., *Soviet Technical Physics Letters*, 8 (6), 296 (1982) and L. A. Ivanyutin et al. *Elektronnaya Tekhnika*, No. 6, 155, 20 (1981).)

As disclosed in the article by Alferov et al., supra, chromium-doped indium phosphide epitaxial layers having resistivities of only approximately $5 \times 10^3$ ohm-cm have been produced. This resistivity level is marginally acceptable as semi-insulating material for discrete devices such as lasers. For arrays of lasers or for integrated circuits, it is highly desirable to have a material with significantly higher resistivity—a resistivity greater than $10^6$ ohm-cm—to avoid electrical leakage and undesirable cross coupling of elements in an integrated circuit.

In order to overcome these limitations, indium phosphide having a resistivity up to $1 \times 10^9$ ohm-cm has been produced utilizing a metal organic chemical vapor deposition (MOCVD) procedure in conjunction with an iron pentacarbonyl or ferrocene based dopant precursor. The use of an iron pentacarbonyl or ferrocene based dopant precursor in the formation of indium phosphide through MOCVD has resulted in device quality semi-insulating layers and has avoided significant loss of dopant through premature deposition of elemental iron. For example, excellent results have been achieved by employing these dopant precursors in conjunction with indium-based organic materials such as alkyl indium-alkyl phosphine adducts, e.g., trimethyl indium-trimethyl phosphine adduct, together with additional phosphine. See J. A. Long et al., *J. of Crystal Growth*, Vol. 69, pp. 10–14 (1984).

While iron doping of indium phosphide is useful for producing high resistivity, semi-insulating semiconductor material, the resulting material has poor thermal stability. Moreover, since iron is a deep acceptor in indium phosphide and because the semi-insulating material is grown in contact with a p-n junction, the semi-insulating material is susceptible to being rendered conductive in the vicinity of the p-type material because rapidly diffusing p-type impurities such as zinc, cadmium, magnesium, and beryllium change the net carrier concentration from an excess of shallow donors toward an excess of shallow acceptors. This has, in turn, caused the search to continue for other dopants to form semi-insulating indium phosphide. Although a large number of alternate transition metal dopants (Co, Cr, and Mn) have been studied for use with indium phosphide, none has achieved a successful combination of good semi-insulating behavior and thermal stability.

Recently, it was reported that titanium doping of bulk indium phosphide resulted in high resistivity semiconductor material which also exhibited good thermal stability. The semi-insulating bulk crystals were grown by liquid encapsulated Czochralski techniques using pyrolytic boron nitride crucibles. See C. D. Brandt et al., *Appl. Phys. Lett.*, Vol. 48, No. 17, pp. 1162–1164 (1986). The high purity titanium source used for liquid encapsulated Czochralski growth is not suited for vapor phase or molecular beam epitaxial growth techniques. Moreover, the results fail to suggest a titanium source suitable for such epitaxial growth techniques which would be capable of producing semiinsulating indium phosphide exhibiting deep donor levels which result from titanium doping as opposed to deep acceptor levels associated with iron doping. While the reported results indicate that titanium doping is more desirable than iron doping in forming semi-insulating indium phosphide, the titanium source and growth techniques applied are incapable of producing or overgrowing semiinsulating indium phosphide epitaxial layers necessary for device fabrication.

SUMMARY OF THE INVENTION

Epitaxial layers of titanium-doped indium phosphide have been produced by a metal organic chemical vapor deposition (MOCVD) procedure in conjunction with a titanium-based metal organic dopant precursor. Layers of indium phosphide formed in accordance with the principles of the invention are semi-insulating, exhibit thermal stability, and permit overgrowth by other materials. Also, the titanium-doped, semi-insulating indium phosphide layers retain semi-insulating characteristics (high resistivity) even when grown in contact with p-type material provided that the concentration of deep donors from titanium exceeds the net concentration of shallow acceptors in the indium phosphide. It has been determined that co-doping or compensation doping of the indium phosphide layer by an organo-metallic acceptor is an efficient way to reach the condition necessary to ensure semi-insulating material, namely, $N_{Ti} > N_A - N_D$ where $N_{Ti}$ is the deep donor concentration from titanium, $N_D$ is the shallow donor concentration and $N_A$ is the total shallow acceptor concentration including the background acceptor concentration, the acceptor concentration from diffusion and the acceptor concentration from co-doping.

The principles of this invention also extend to epitaxial growth by MOCVD of other Group III–V compounds such as the binary compositions of indium phosphide or gallium antimonide and the ternary and quaternary derivatives thereof.

Additionally, it has been found that the combination of titanium doping and iron doping results in a semi-insulating epitaxial Group III–V layer which is capable of trapping background excess carriers regardless of the net background carrier conductivity type.

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Figure 1:
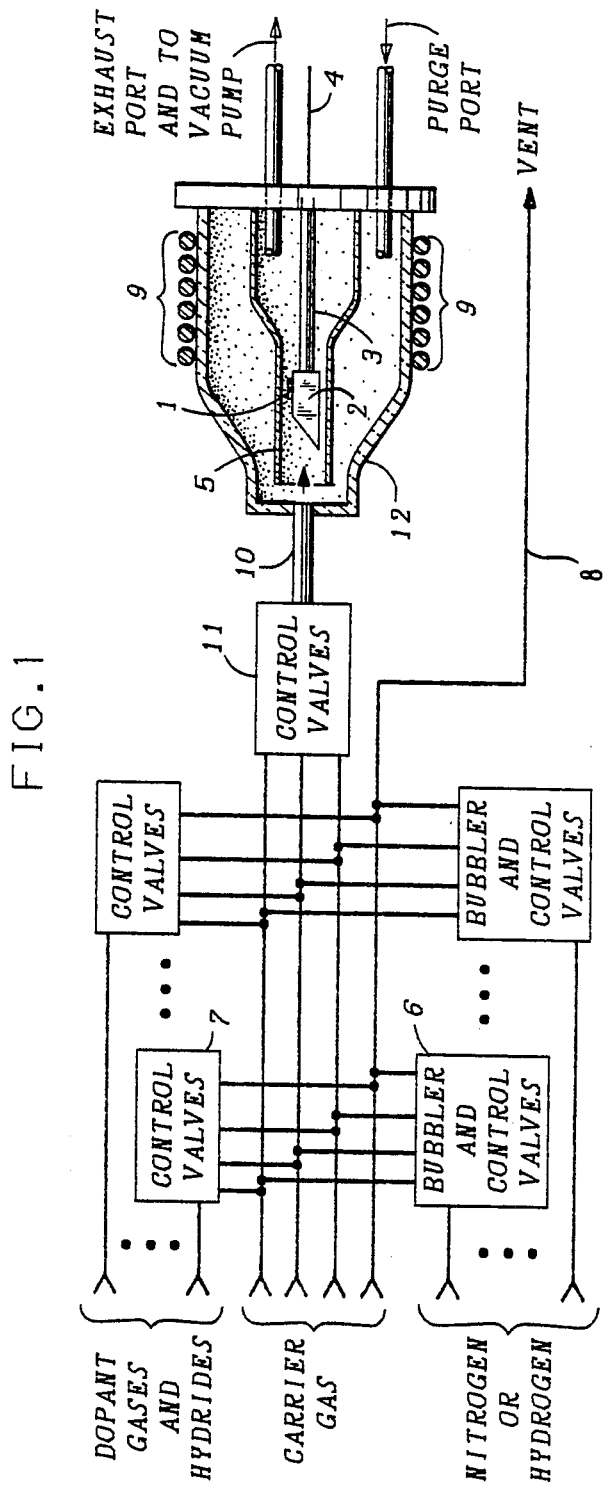
FIG. 1 is illustrative of apparatus useful in practicing the invention.

The invention involves the use of a titanium-based metal organic dopant precursor and in some cases p-type co-dopant in conjunction with an indium-based organic material to produce growth of a semi-insulating, indium phosphide-based material and ultimately to produce a semiconductor device. It is understood by those skilled in the art that the term "semi-insulating" implies a resistivity greater than or equal to $10^3$ ohm-cm. The metal organic deposition of indium phosphide has been extensively described in articles such as "GaAs and Related Compounds," J. P. Duchemin et al., *Institute of Physics Conference Series* 45, 1979, page 45; "International Meeting on the Relationship Between Epitaxial Growth Conditions and the Properties of Semiconductor Epitaxial Layers," A. K. Chatterjee et al., Perpignan, France, 1982. The particular indium-based organic material utilized for deposition of the indium phosphide-based material in conjunction with the titanium-based metal organic dopant precursor is not critical. Typically, indium alkyls wherein the alkyl preferably has 1 to 5 carbon atoms, such as trimethyl indium and triethyl indium, in conjunction with a source of phosphorus such as phosphine produces indium phosphide of satisfactory quality.

In a preferred embodiment, trimethyl indium is introduced into the gas stream by flowing a carrier gas such as hydrogen or an inert gas such as nitrogen or helium through a bubbler containing trimethyl indium. It is desirable that the gas be relatively pure so that impurities are not introduced into the deposited indium phosphide. For example, it is advantageous but not essential to employ high purity hydrogen that is further purified by palladium diffusion. Sufficient carrier gas is then flowed through the bubbler to produce a saturated combination of carrier gas and gas-based precursor. It should be noted that, while saturation of the gas flow is not a necessary condition, control is achieved by utilizing a saturated gas flow. A saturated gas flow is particularly important when growing ternary and quaternary indium phosphide-based materials. Typically, gas flows in the range 50 to 2000 sccm are utilized with a bubbler heated to a temperature in the range −20 to +20 degrees C. to produce a saturated gas flow. In experimental practice, controlled samples are employed to determine suitable conditions for producing saturation for a given indium-based organic composition.

A source of phosphorus such as phosphine is also introduced into the gas flow. Generally, it is desirable to have a molar excess of phosphorus source to organic indium-based compound of at least 50:1 and preferably at least 75:1. Typically ratios greater than 100:1, although not precluded, are also not desirable since they are uneconomic.

The dopant precursor, a metal organic titanium based composition, is introduced to yield a molar ratio in the gas stream of titanium to indium in the range $10^{-3}$ to $10^{-6}$. Molar ratios significantly higher than $10^{-3}$ lead to inclusion of a second composition phase in the deposition while molar ratios less than $10^{-6}$ lead to insufficient resistivities in deposited indium phosphide-based layers having a net carrier concentration of approximately $N_A-N_D \sim 2\times 10^{15}$cm$^{-3}$.

Several organo-metallic titanium-based dopant precursor compositions are employable. For example, metal organic titanium-based compounds from the titanium amine group, the titanium arene group and the titanium alkyl and arene alkyl group are employable. In particular, the metal organic titanium-based compounds suggested as precursors are:

| | |
|---|---|
| tetra isopropyl titanate | } chelates |
| tetra butyl titanate | } esters |
| tetra (2-ethylhexyl) titanate | |
| tetrakis (diethylamino) titanium | } amine |
| tetrakis (dimethylamnio) titanium | |
| cycloheptadienyl cycloheptatrienyl titanium | |
| cycloheptadienyl cycloheptatrienyl titanium | |
| cyclopentadienyl cyclooctatetraenyl titanium | |
| bis(benzene)titanium | } arene |
| bis(toluene)titanium | |
| bis(mesitylene)titanium | |
| tetramethyl titanium | |
| bis (cyclopentadienyl) titanium dimethyl | } alkyl and arene alkyls |
| tris (cyclopentadienyl) titanium | |
| tetra(neopentyl)titanium | |

In order to be useful as precursors, the titanium bearing species should have an appreciable vapor pressure (greater than $1\times 10^{-5}$ torr) at temperatures less than 200° C. Moreover, it is desirable for the selected species to decompose thermally, catalytically or otherwise at temperatures below 850° C. leaving volatile by-products behind while depositing titanium at the growth site. It should be understood by those skilled in the art that the precursor compounds listed above can be expanded to include numerous arene substituted derivatives and analogs of similar volatility.

Conventional techniques are utilized to introduce the dopant precursor. For example, in the case of tetrakis (diethylamino) titanium, which is a liquid at room temperature, a gas flow such as a nitrogen gas flow is bubbled through the tetrakis (diethylamino) titanium. Typical gas flows in the range 10 to 70 sccm at a temperature in the range 0° to 50° C. produce the desired ratio of indium to titanium in the gas stream. For metal organic titanium based dopant precursors which require use of an effusion source, a carrier gas flow is first introduced into a gas flow control means such as an electronic mass flow controller or needle valve that is adjusted to yield the desired titanium-to-indium ratio and then passed over the effusion source containing the precursor. For example, in the case of an effusion source comprising cycloheptadienyl cycloheptatrienyl titanium precursor, a bright blue solid, the effusion source is typically heated to 50°–200° C. with a helium or argon flow through the source at a flow rate from 10–1000 sccm.

As described above, it has also been found that co-doping with an acceptor-based dopant precursor compensates donor impurities during indium phosphide growth and maintains the resistivity of the semi-insulating indium phosphide layer. Co-doping is essential when the net background donor concentration $(N_D-N_A)$ is greater than zero. Since titanium is a deep donor in indium phosphide-based compounds, it can only trap excess acceptors and not excess donors. In order to illustrate the latter point, co-doping has been omitted from the MOCVD growth of titanium-doped indium phosphide epitaxial layers during experimental investigation. It has been determined that the MOCVD growth equipment and growth parameters tend to produce epitaxial layers of indium phosphide in which the net background carrier concentration exhibits an excess of donor impurities over acceptor impurities. As a result, the titanium-doped indium phosphide layers grown with this particular MOCVD equipment were conductive with a resistivity less than 10 ohm-cm. When a cadmium-based co-dopant was introduced, the resistivity of the titanium-doped, indium phosphide epitaxial layers exceeded $10^7$ ohm-cm. Again, it is important to understand that the results discussed above concerning a need for co-doping are specific to the actual MOCVD growth equipment and growth parameters used experimentally here.

Acceptor-based dopant precursor compounds include organo-metallic cadmium based precursors, organo-metallic magnesium based precursors, organo-metallic zinc based precursors, and organo-metallic beryllium based precursors and organo-metallic germanium-based precursors. Specific exemplary acceptor based dopant precursor compounds include dimethyl cadmium, diethyl zinc, dimethyl zinc, bis (cyclopentadienyl) magnesium, bis (methylcyclopentadienyl) magnesium, diethyl beryllium, and tetramethyl germanium. The acceptor-based dopant precursor compounds are introduced to the gas flow by the standard techniques previously described.

It should be noted that co-doping is not limited to the use of the aforementioned materials alone. Other materials which are useful in preparing semiinsulating semiconductor material are acceptable and even desirable as codopants. For example, the use of iron as a co-dopant with titanium results in a semi-insulating material having deep traps for both electrons and holes. It is well known in the art that iron-based dopant precursor compositions include ferrocene or ferrocene based compositions or iron carbonyl based compositions. The ferrocene based compositions comprise dimethyl ferrocene, vinyl ferrocene, and butyl ferrocene. The iron pentacarbonyl based compositions include butadiene iron tricarbonyl, cyclooctatetraene iron tricarbonyl, 1,3-pentadiene iron tricarbonyl, cyclohexadiene iron tricarbonyl, cycloheptadiene iron tricarbonyl, cycloheptatriene iron tricarbonyl, cyclopentadienyl iron dicarbonyl dimer, and methylcyclopentadienyl iron dicarbonyl dimer. It should be understood by those skilled in the art that the precursor compounds listed above can be expanded to include numerous arene substituted derivatives and analogs and related compounds.

Although the deposition process has been described in terms of indium phosphide, the principles of this invention also extend to indium phosphide-based materials in general, that is, indium phosphide as well as ternary and quaternary derivatives thereof which include both indium and phosphorus. These indium phosphide-based materials are represented as $In_xGa_{1-x}As_yP_{1-y}$ and $In_xGa_{1-x}Al_yP$, where $0<x\leq 1$ and $0\leq y<1$. The principles of this invention also extend to the gallium antimonide-based materials in general, that is, gallium antimonide as well as ternary and quaternary derivatives thereof which include both gallium and antimony. These gallium antimonide-based materials are represented as $In_xGa_{1-x}As_ySb_{1-y}$ and $Al_xGa_{1-x}As_ySb_{1-y}$, where $0 \leq x < 1$ and $0 \leq y < 1$. In the derivative systems, either arsenic or gallium or aluminum or antimony or a combination of arsenic, gallium, antimony and aluminum is introduced into the gas stream by expedients such as an admixture of $AsH_3$ and use of a bubbler containing alkyl gallium and/or alkyl aluminum compounds, respectively, as described in *Journal of Crystal Growth*, 55, 64 (1981), by J. P. Duchemin et al. Formation of device active regions and completion of a semiconductor device are then accomplished by conventional techniques.

The following examples are illustrative of the invention.

EXAMPLE 1

A polished indium phosphide substrate 1 is placed on a SiC coated graphite susceptor 2. Substrate 1 measures 1 cm.×2 cm. and 0.05 cm. thickness. Susceptor 2 is supported by a hollow fixed silica tube 3. A thermocouple 4 is inserted in the silica tube 3. Susceptor 2 and silica tube 3 are loaded into a fused silica reactor liner 5 contained in fused silica reactor 12. Fused silica reactor liner 5 is approximately 33 mm. in diameter.

Initially, a hydrogen flow is established through reactor inject line 10 over the substrate 1 at a rate of 8 l/min. A plurality of bubbler and control valve arrangements such as bubbler and control valve 6 are employed to introduce metal organic precursor materials into the gas flow. A bubbler containing trimethyl indium is cooled to 10° C. with a nitrogen flow of 1500 sccm; another bubbler containing tetrakis (diethyamino) titanium (25 g. liquid) is maintained at 26° C. with a nitrogen flow through it of 50 sccm; yet another bubbler containing dimethyl cadmium is cooled to −5° C. with a nitrogen flow through it of 0.05 sccm. Control valves in each bubbler are adjusted to direct the combined gas flow into vent 8 bypassing the reactor. Phosphine (100%) is injected into the reactor at a rate of 200 sccm while the susceptor is heated to 650° C. by RF induction coils 9. When susceptor 2 reached the equilibrium temperature, the trimethyl indium gas flow is switched via control valve 11 into reactor inject line 10 to commence epitaxial crystal growth. Under these conditions, nominally undoped indium phosphide is grown at a rate of approximately 2 μm/hr.

After approximately a 45 minute growth period for the nominally undoped indium phosphide layer, the tetrakis (diethylamino) titanium and dimethyl cadmium gas flows are switched into inject line 10 to start growth of semi-insulating indium phosphide. All metal organic gas flows are terminated after another 45 minute growth period.

Substrate 1 is maintained at 650° C. after the growth period to ensure removal of all metal organic vapors from the reactor. Then RF heating is also terminated to allow substrate cooling. When substrate 1 reaches a temperature of 50° C., the phosphine flow is terminated and the reactor is flushed (through the purge port) with nitrogen and hydrogen.

The resulting indium phosphide layer had a resistivity of $10^7$ ohm-cm.

EXAMPLE 2

The same procedure was used as in Example 1 except that the nitrogen flow through the bubbler containing tetrakis (diethylamino) titanium is increased between 100 and 300 sccm. The resulting indium phosphide epitaxial layer has the same resistivity as in Example 1.

EXAMPLE 3

The same procedure was used in Example 2 except that cyclopentadienyl cycloheptatrienyl titanium precursor was used instead of tetrakis (diethylamino) titanium and argon or helium flow was used instead of nitrogen as the purge gas at a flow rate of 10–1000 sccm and at a temperature of 50°–250° C. Titanium concentration as high as $5 \times 10^{18} cm^{-3}$ was measured by secondary ion mass spectroscopy. Deep level transient spectroscopy indicated that the deep donor concentration due to titanium was $3 \times 10^{16} cm^{-3}$.

EXAMPLE 4

In this example, ferrocene is introduced into the gas flows described in Example 1. The ferrocene containing bubbler is maintained at 5° C. with a throughflow of nitrogen at 50 sccm. The resulting indium phosphide layer is both iron-doped and titanium-doped and exhibits high resistivity.

EXAMPLE 5

In this example, the same technique as described in Example 3 is used except that the dimethyl cadmium flow is eliminated. The resulting indium phosphide layer retains high resistivity.

What is claimed is:

1. A process for producing a semiconductor body comprising the steps of (1) forming a region of semi-insulating Group III–V based material by contacting a substrate with a deposition gas stream and (2) forming a conductive region for said semiconductor body, the process characterized in that said region of semi-insulating material is further formed by introducing into said deposition gas stream a vaporized dopant precursor comprising a composition chosen from the group consisting of organo-metallic titanium-based compositions, wherein said deposition gas stream is produced by combining entity compositions chosen from the group consisting of an organic indium-based compound together with a source of phosphorus and an organic gallium-based compound together with a source of antimony.

2. The process as defined in claim 1 wherein the semi-insulating Group III–V based material includes indium phosphide.

3. The process as defined in claim 2 wherein the source of phosphorus comprises phosphine.

4. The process as defined in claim 3 wherein the organic indium-based compound comprised as indium trialkyl.

5. The process as defined in claim 4 wherein said indium trialkyl comprises trimethyl indium.

6. The process as defined in claim 2 wherein the organic indium-based compound comprised as indium trialkyl.

7. The process as defined in claim 6 wherein said indium trialkyl comprises trimethyl indium.

8. The process as defined in claim 1 wherein said organometallic titanium-based compositions comprises a composition chosen from the group consisting of titanium amine group compounds, titanium arene group compounds, and titanium alkyl and arene alkyl group compounds.

9. The process as defined in claim 8 wherein the semi-insulating Group III–V based material includes indium phosphide.

10. The process as defined in claim 9 wherein the source of phosphorus comprises phosphine.

11. The process as defined in claim 10 wherein the organic indium-based compound comprises an indium trialkyl.

12. The process as defined in claim 11 wherein said indium trialkyl comprises trimethyl indium.

13. The process as defined in claim 9 wherein the organic indium-based compound comprises an indium trialkyl.

14. The process as defined in claim 13 wherein said indium trialkyl comprises trimethyl indium.

15. The process as defined in claim 1 wherein said deposition gas stream further comprises a composition chosen from the group consisting of organo-metallic cadmium based precursor compounds, organo-metallic zinc based precursor compounds, organo-metallic magnesium based precursor compounds, organo-metallic beryllium based precursor compounds, organometallic germanium based precursor compounds, ferrocene, ferrocene based compounds, and iron carbonyl compounds.

16. The process as defined in claim 15 wherein said organometallic titanium-based compositions comprises a composition chosen from the group consisting of titanium amine group compounds, titanium arene group compounds, and titanium alkyl and arene alkyl group compounds.

17. The process as defined in claim 16 wherein the semi-insulating Group III–V based material includes indium phosphide.

18. The process as defined in claim 17 wherein the source of phosphorus comprises phosphine.

19. The process as defined in claim 18 wherein the organic indium-based compound comprises an indium trialkyl.

20. The process as defined in claim 19 wherein said indium trialkyl comprises trimethyl indium.

21. The process as defined in claim 17 wherein the organic indium-based compound comprises an indium trialkyl.

22. The process as defined in claim 21 wherein said indium trialkyl comprises trimethyl indium.

* * * * *